US006496408B2

(12) United States Patent
McClain

(10) Patent No.: US 6,496,408 B2
(45) Date of Patent: Dec. 17, 2002

(54) SELECTIVE DEVICE COUPLING

(75) Inventor: Jeff A. McClain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,245

(22) Filed: Aug. 30, 2001

(65) Prior Publication Data

US 2002/0024841 A1 Feb. 28, 2002

Related U.S. Application Data

(62) Division of application No. 09/487,975, filed on Jan. 20, 2000, now Pat. No. 6,292,387.

(51) Int. Cl.$^7$ .................................................. G11C 11/24
(52) U.S. Cl. ......................................... 365/149; 365/51
(58) Field of Search ........................... 365/149, 51, 52, 365/205, 207, 63, 226, 227

(56) References Cited

U.S. PATENT DOCUMENTS

| 5,500,815 | A | * | 3/1996 | Takase et al. ................ 365/149 |
| 5,537,347 | A | | 7/1996 | Shiratake et al. ........... 365/149 |
| 5,544,108 | A | | 8/1996 | Thomann .................... 365/201 |
| 5,666,323 | A | | 9/1997 | Zagar ........................... 365/233 |
| RE35,825 | E | | 6/1998 | Zager ........................... 365/226 |
| 5,761,145 | A | | 6/1998 | Zagar et al. ................. 365/226 |
| 5,801,983 | A | * | 9/1998 | Saeki ........................... 365/149 |
| 5,894,444 | A | | 4/1999 | Seyyedy ....................... 365/205 |
| 5,970,008 | A | | 10/1999 | Zagar et al. ................. 365/226 |
| 5,999,467 | A | | 12/1999 | Bissey ......................... 365/201 |

* cited by examiner

Primary Examiner—Richard Elms
Assistant Examiner—Anh Phung
(74) Attorney, Agent, or Firm—Schwegman, Lundberg, Woessner & Kluth, P.A.

(57) ABSTRACT

Memory devices and other integrated circuit devices having a first capacitor and a second capacitor with an interposing selective isolation device, and methods of their operation. A selective isolation device is a device selectively in a state of conductance or non-conductance. When the selective isolation device is in a state of conductance, the first capacitor is coupled to the second capacitor. When the selective isolation device is in a state of non-conductance, the first capacitor is electrically isolated from the second capacitor. In memory devices, such parallel coupling of adjacent storage capacitors of adjacent memory cells is useful in increasing beta ratio and providing defect isolation. Such coupling of adjacent storage capacitors generally reduces the number of uniquely addressable memory cells.

33 Claims, 10 Drawing Sheets

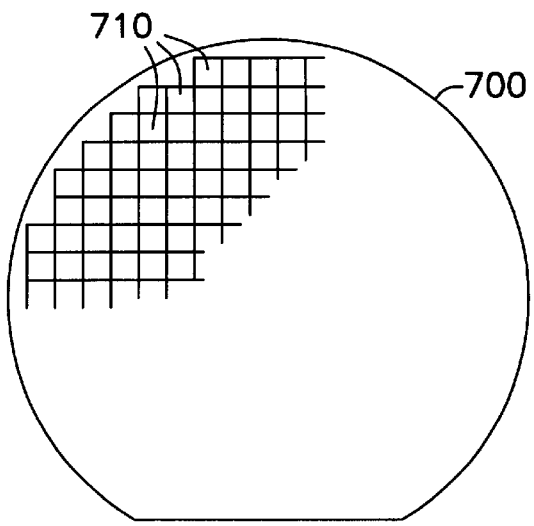
FIG. 7
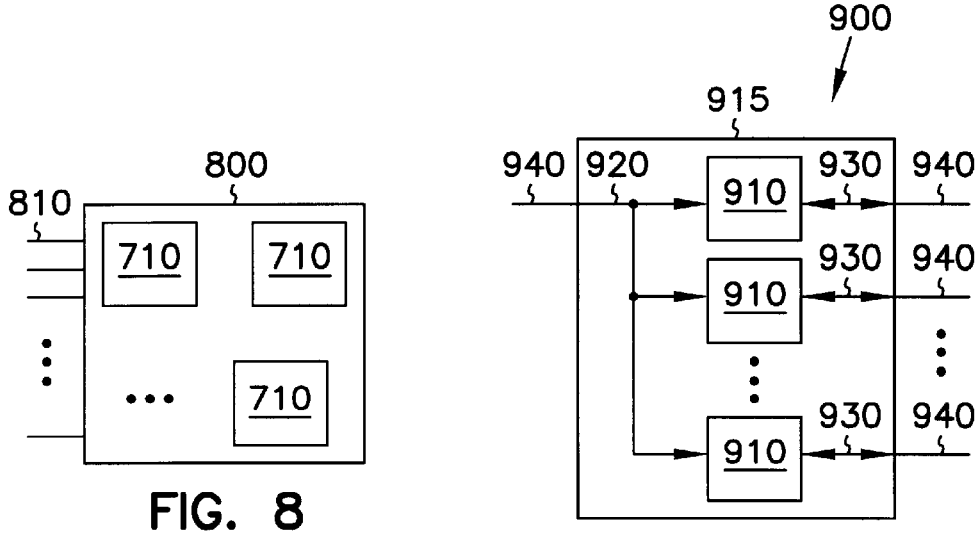
FIG. 8
FIG. 9
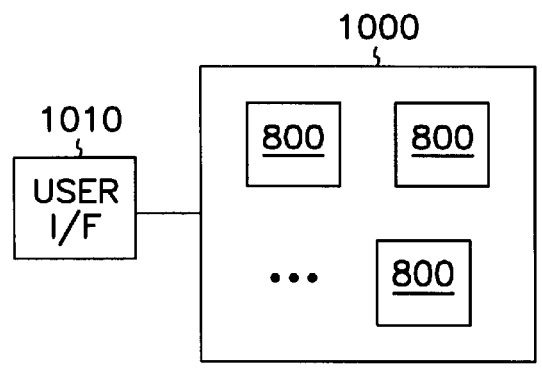
FIG. 10

SELECTIVE DEVICE COUPLING

This application is a division of U.S. patent application Ser. No. 09/487,975, filed on Jan. 20, 2000, now U.S. Pat. No. 6,292,387 issued on Sep. 18, 2001, the specification of which is incorporated herein by reference.

TECHNICAL FIELD

The present invention relates generally to selective coupling of semiconductor devices and in particular to methods and facilitating circuitry to permit selective coupling of multiple storage cells to improve memory device characteristics or circumvent memory device defects.

BACKGROUND

Many electronic systems include a memory device, such as a Dynamic Random Access Memory (DRAM), to store data. A typical DRAM includes an array of memory cells. Each memory cell includes a storage capacitor that stores the data in the cell and an access transistor that controls access to the data. The charge stored across the capacitor is representative of a data bit and is usually either a high voltage, logic 1, or a low voltage, logic 0.

Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. Thus, each such memory cell is associated with two digit lines, digit and digit complement.

Typically, the memory cells are arranged in an array and each cell has an address identifying its location in the array. The array includes a configuration of intersecting conductive lines, and memory cells are generally associated with the intersections of the lines. In order to read from or write to a cell, the particular cell in question must be selected, or addressed. The address for the selected cell is represented by input signals to a word line or row decoder and to a digit line or column decoder. The row decoder activates a word line in response to the word line address. The selected word line activates the access transistors for each of the memory cells in communication with the selected word line. The column decoder selects a digit line pair in response to the digit line address. For a read operation, the data corresponding to the selected memory cell is sensed, and the data and its complement are each latched to one digit line of the digit line pair. The column decoder further selects the digit line containing the data corresponding to the addressed memory cell for output.

The ability to sense the data stored in the storage capacitor is a critical operation of the memory device. This ability is a function of the sensitivity of the sense amplifiers to the potential differential, or cell margin, across the digit line pair. Increasing the signal-to-noise ratio thus improves the reliability of the sensing operation. Increasing the signal-to-noise ratio generally results from the increase in beta ratio, which is the ratio of the capacitance of the memory cell to the capacitance of the digit line. Increasing the beta ratio is often accomplished by isolating one half of the digit line pair from the sense amplifier.

In addition to improving reliability of the sensing operation, increases in beta ratio also permit lower power consumption in a memory device. By increasing the beta ratio, larger charge leakage is tolerable in the storage capacitor without adversely affecting the sensing operation. This permits lower refresh rates and, thus, lower power consumption.

Devices having insufficient beta ratio or excessive charge leakage are generally unsuited for their intended uses. While many causes of insufficient beta ratio and excessive charge leakage may be curable through the use of redundant devices, as is well known in the art, some causes may be global such that the redundant device also exhibits insufficient beta ratio or excessive charge leakage. Accordingly, there is a need in the art for devices capable of modifying the ratio of storage capacitance to digit line capacitance, and methods of their use.

SUMMARY

For one embodiment, the invention includes an integrated circuit device. The integrated circuit device includes a first capacitor, a second capacitor, and a selective isolation device interposed between the first capacitor and the second capacitor.

For another embodiment, the invention includes an integrated circuit device. The integrated circuit device includes a first capacitor, a second capacitor, and a selective isolation device interposed between the first capacitor and the second capacitor, wherein the selective isolation device has a first state and a second state. The integrated circuit device further includes a device driver coupled to the selective isolation device to selectively place the selective isolation device in a state selected from the group consisting of the first state and the second state. The first capacitor and the second capacitor are electrically isolated when the selective isolation device is in the first state. The first capacitor and the second capacitor are electrically coupled when the selective isolation device is in the second state.

For a further embodiment, the invention includes a memory device. The memory device includes a first storage capacitor of a first memory cell, a second storage capacitor of a second memory cell, and a selective isolation device interposed between the first storage capacitor and the second storage capacitor.

For a still further embodiment, the invention includes a memory device. The memory device includes a first storage capacitor of a first memory cell, a second storage capacitor of a second memory cell, and a selective isolation device interposed between the first storage capacitor and the second storage capacitor, wherein the selective isolation device has a first state and a second state. The memory device further includes a device driver coupled to the selective isolation device to selectively place the selective isolation device in a state selected from the group consisting of the first state and the second state. The first storage capacitor and the second storage capacitor are electrically isolated when the selective isolation device is in the first state. The first storage capacitor and the second storage capacitor are electrically coupled when the selective isolation device is in the second state.

For yet another embodiment, the invention includes a memory device. The memory device includes a first storage capacitor of a first memory cell, a second storage capacitor of a second memory cell, a first digit line, and a second digit line. The memory device further includes a first access transistor coupled to the first storage capacitor and the first digit line for selectively coupling the first storage capacitor to the first digit line, a second access transistor coupled to the second storage capacitor and the second digit line for selectively coupling the second storage capacitor to the second digit line, and a selective isolation device interposed between the first storage capacitor and the second storage capacitor, and having a first state and a second state. The first storage capacitor and the second storage capacitor are electrically isolated when the selective isolation device is in the first state. The first storage capacitor and the second storage capacitor are electrically coupled when the selective isolation device is in the second state.

For one embodiment, the invention includes a method of operating a memory device. The method includes coupling a first storage capacitor of a first memory cell to a second storage capacitor of a second memory cell. The method further includes coupling the first storage capacitor to a digit line while the first storage capacitor is coupled to the second storage capacitor.

For another embodiment, the invention includes a method of operating a memory device. The method includes coupling a first storage capacitor of a first memory cell to a second storage capacitor of a second memory cell during a first period and coupling the first storage capacitor to a digit line during the first period. The method further includes electrically isolating the first storage capacitor of the first memory cell from the second storage capacitor of the second memory cell during a second period and coupling the first storage capacitor to the digit line during the second period.

For a further embodiment, the invention includes a method of operating a memory device. The method includes coupling a first storage capacitor of a first memory cell to a second storage capacitor of a second memory cell during a first period and accessing the first memory cell during the first period. The method further includes electrically isolating the first storage capacitor of the first memory cell from the second storage capacitor of the second memory cell during a second period and accessing the first memory cell during the second period.

For yet another embodiment, the invention includes a method of operating a memory device. The method includes coupling a first storage capacitor of a first memory cell to a second storage capacitor of a second memory cell, thereby forming a coupled capacitor pair. The method further includes selecting an access path to the coupled capacitor pair, wherein the access path is an access path coupled to the first storage capacitor or an access path coupled to the second storage capacitor, and coupling the coupled capacitor pair to a digit line through the selected access path. For a further embodiment, selecting an access path includes resolving the address by ignoring the least significant bit of the address.

For one embodiment, the invention includes a method of operating a memory device. The method includes coupling a first storage capacitor of a first memory cell to a second storage capacitor of a second memory cell during a first period, thereby forming a coupled capacitor pair. The method further includes selecting a first access path to the coupled capacitor pair, wherein the first access path is an access path coupled to the first storage capacitor or an access path coupled to the second storage capacitor, and coupling the coupled capacitor pair to a digit line through the first access path during the first period. The method still further includes electrically isolating the first storage capacitor of a first memory cell from the second storage capacitor of the second memory cell during a second period, selecting a second access path coupled to the first storage capacitor, and coupling the first storage capacitor to the digit line through the second access path during the second period.

The invention further includes apparatus and methods of varying scope.

BRIEF DESCRIPTION OF THE DRAWINGS

FIG. 7 is an elevation view of a substrate containing semiconductor dies.

FIG. 8 is a block diagram of a circuit module.

FIG. 9 is a block diagram of a memory module.

FIG. 10 is a block diagram of an electronic system.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

Figure 1A:
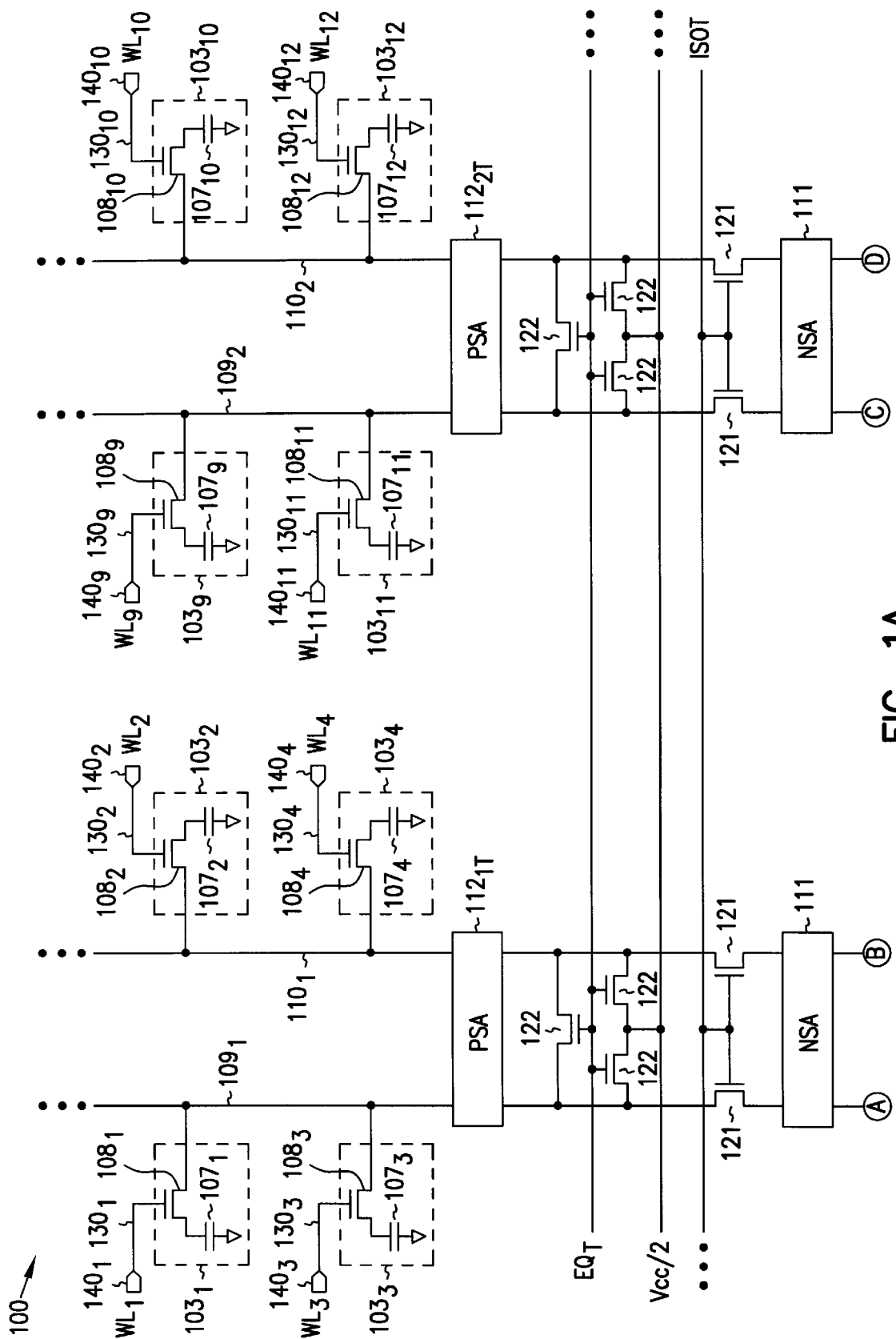
FIGS. 1A–1B are a schematic of a portion of a dynamic memory device.
Figure 1B:
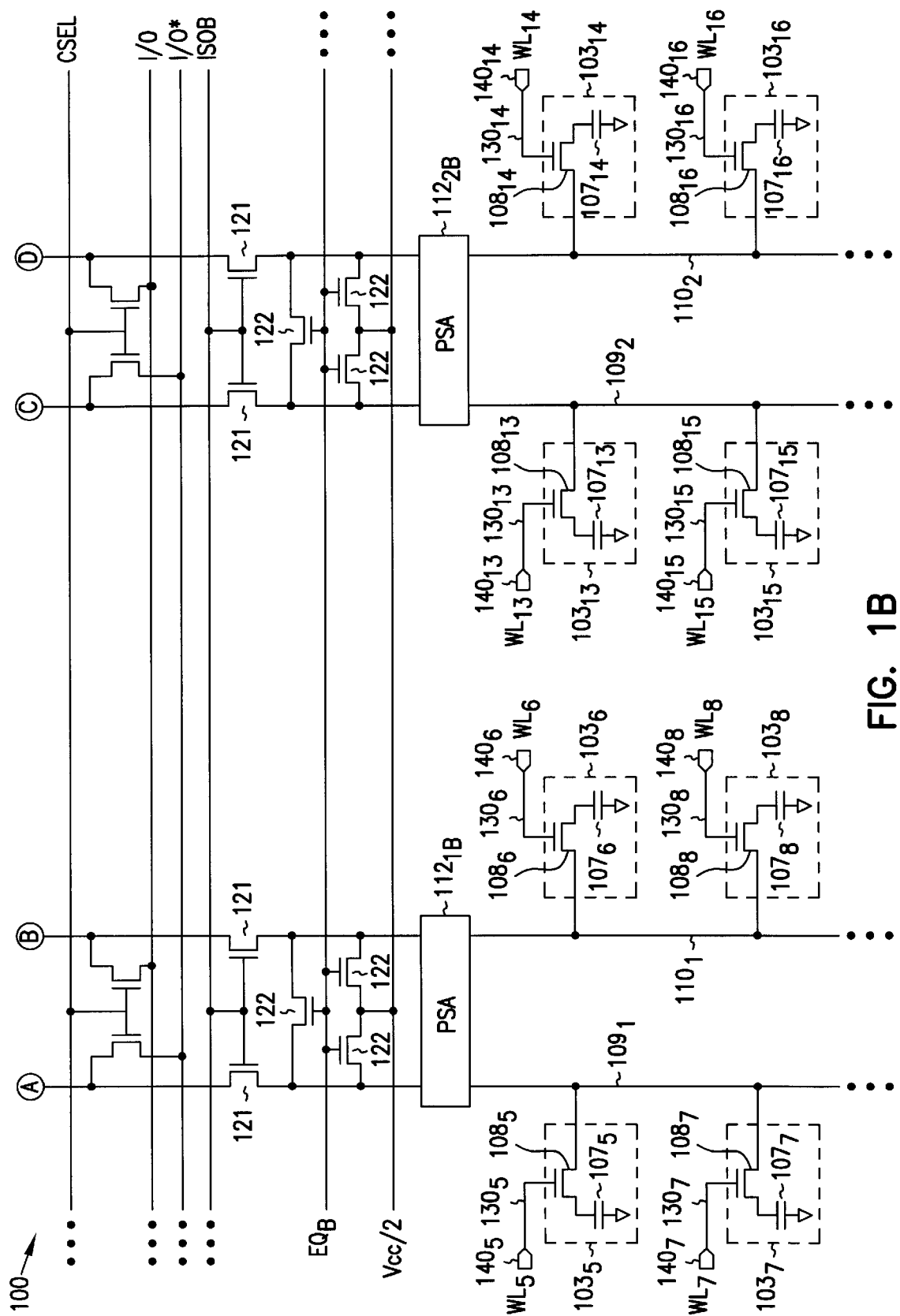

FIGS. 1A–1B are a schematic of a portion of a dynamic memory device 100 which stores digital information or data in an arrangement of memory cells 103. Memory cells 103 are representative of a portion of memory cells of an array or subarray. Each memory cell 103 comprises a storage capacitor 107 capable of holding a charge and an access transistor 108 for accessing the capacitor charge. It is noted that FIGS. 1A–1B are a schematic showing electrical connectivity of a dynamic memory device according to one embodiment and do not necessarily depict relative physical location of device elements. The memory device 100 is adapted for selective device coupling as described in subsequent embodiments.

The charge is a voltage potential referred to as a data bit and is typified as having either a high voltage, logic 1, or a low voltage, logic 0. The data bit is amplified and latched to the digit 109 and digit complement 110 lines by the N-sense amplifier 111 and P-sense amplifier 112. The digit line 109 and the digit complement line 110 form a digit line pair. The P-sense amplifier 112 pulls one digit line of the digit line pair to a high potential, usually the supply potential, $V_{CC}$, while the N-sense amplifier 111 pulls the remaining digit line to a ground potential.

The operation of the memory device 100 will be described in relation to a standard access operation, specifically a standard read operation, to better describe the relationship of the various elements. The standard read operation will further be described with reference to a read request directed to memory cell $103_3$. Read requests directed to other memory cells of memory device 100 proceed in like fashion.

In a standard read operation of memory cell $103_3$, the bottom portion of the digit line pair is isolated from the top portion by latching control signal ISOB low, thus transitioning isolation transistors 121 associated with ISOB to an off state. Digit line $109_1$ and digit complement line $110_1$ are then equilibrated through equilibrate transistors 122 associated with $EQ_T$. As control signal $EQ_T$ is brought low, the equilibrate transistors 122 are transitioned off, and memory cell $103_3$ is coupled to digit line $109_1$ by activating the access transistor $108_3$. Access transistor $108_3$ is activated by bringing word line $130_3$ high upon firing word line driver $140_3$, thus coupling storage capacitor $107_3$ to digit line $109_1$.

The charge stored in storage capacitor $107_1$ is shared with digit line $109_1$ such that the potential of digit line $109_1$ is pulled up if the data bit stored in storage capacitor $107_3$ is a logic 1, or pulled down if the data bit stored in storage capacitor $107_3$ is a logic 0. The sense amplifiers then sense the differential, or cell margin, across the digit line pair. Typically, due to relative sensitivities of NMOS transistors (not shown) of N-sense amplifiers, N-sense amplifier $111_1$ is fired or activated first to sense the differential and pull the digit line with the lower potential to ground. The P-sense amplifier $112_{1T}$ is then fired to pull up the remaining digit line of the digit line pair, typically to $V_{CC}$.

Upon sensing the data of memory cell $103_3$, control signal CSEL it transitioned high to couple digit line $109_1$ and digit complement line $110_1$ to I/O line 114 and I/O complement line 115 respectively. Coupling the digit line pair to the I/O line pair thus permits reading the data stored in the accessed memory cell across the I/O line pair.

The memory cells in a dynamic memory device, such as those described with reference to FIGS. 1A–1B, are typically placed in close proximity to adjacent memory cells in order to increase memory capacity for a given area of a semiconductor die on which they are formed. Adjacent memory cells generally use some form of isolation therebetween to inhibit charge leakage to neighboring cells. Common isolation techniques include, for example, the formation of a field oxide or insulated trench between adjacent storage capacitors. Another technique finding use recently involves interposing an active isolation device, such as a field effect transistor, between the adjacent storage capacitors, and holding the active isolation device in a state of non-conductance.

Figure 2:
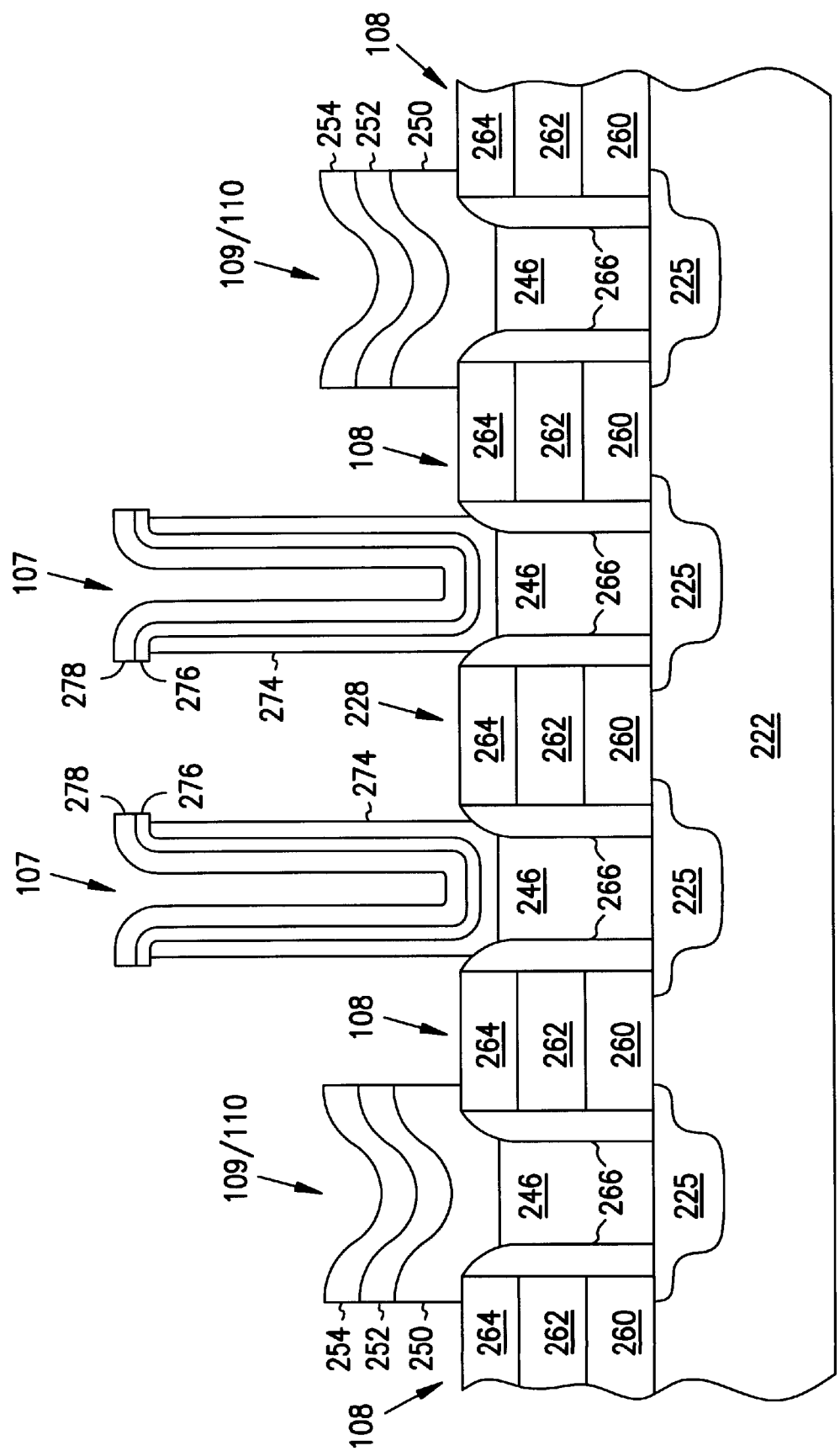
FIG. 2 is a cross-sectional view of a portion of a memory device.

FIG. 2 is a cross-sectional view of a portion of a memory device showing one example of the use of an active isolation device adapted as a selective isolation device, i.e., a device selectively in a state of conductance or non-conductance. FIG. 2 depicts two adjacent storage capacitors 107 with a selective isolation device 228 interposed between the adjacent storage capacitors 107. Selective isolation device 228 is any device capable of selectively isolating or coupling the adjacent storage capacitors 107, and is shown in the embodiment of FIG. 2 to be a field effect transistor where a control voltage applied to the gate will determine conductance between the source and drain. The selective isolation device 228 has a first or deactivated state (non-conductance) such that adjacent storage capacitors 107 are electrically isolated, and a second or activated state (conductance) such that adjacent storage capacitors 107 are electrically coupled, forming a coupled capacitor pair. An active isolation device will be deemed not to be a selective isolation device if the active isolation device is configured to maintain a state of non-conductance during normal operation of the integrated circuit device to which it pertains.

Selective isolation device 228 is shown to have the same construction as the access transistors 108. While this facilitates formation of selective isolation device 228 concurrently with the formation of the access transistors 108, such construction is not required. Common constructions might include a polysilicon layer 260, a conductor layer 262, a dielectric cap layer 264 and insulative spacers 266. The conductor layer may contain one or more conductive layers, such as a refractory metal silicide/conductive barrier/refractory metal construction. The dielectric cap layer 264 and insulative spacers 266 are generally an insulating material, such as silicon oxide, silicon nitride or silicon oxynitride, and may include more than one insulating material.

In one embodiment, each storage capacitor 107 is a stacked container capacitor as shown in FIG. 2, having a conductive bottom electrode 274, a dielectric layer 276 and a conductive top electrode 278. Other capacitor types and constructions are suitable for use with the embodiments disclosed herein.

Each storage capacitor 107 is coupled to an access transistor 108 through a conductive plug 246, generally a conductively-doped polysilicon, and a conductively-doped source/drain region 225 formed in substrate 222. Each access transistor 108 is in turn coupled to a digit line 109/110 through a conductive plug 246 and a source/drain region 225 formed in substrate 222. In one embodiment, the digit line 109/110 is shown to contain a conductively-doped polysilicon layer 250, a conductor layer 252 and a dielectric cap layer 254. Other constructions are suitable for use with the various embodiments disclosed herein. When a word line driver 140 (not shown in FIG. 2) activates an access transistor 108, digit line 109/110 is coupled to its associated storage capacitor 107.

In the case where substrate 222 has a P-type conductivity and source/drain regions 225 have an N-type conductivity, selective isolation device 228 provides electrical isolation relative to adjacent memory cells when selective isolation device 228 is held to logic 0 state, such as a ground potential or suitable negative voltage. In the case where substrate 222 has an N-type conductivity and source/drain regions 225 have a P-type conductivity, selective isolation device 228 provides electrical isolation relative to adjacent memory cells when selective isolation device 228 is held to logic 1 state, such as supply potential, $V_{CC}$, or other suitable positive voltage.

Digit line 109/110 on the left side of FIG. 2 may be the same digit line 109/110 as shown on the right side of FIG. 2. As an example, digit line 109/110 on the left side may extend outside the plane of the drawing, run parallel to storage capacitors 107, and return to the plane of the drawing at digit line 109/110 on the right side. Alternatively, digit line 109/110 on the left side of FIG. 2 may be distinct from digit line 109/110 on the right side of FIG. 2. As an example, digit lines 109/110 may both extend outside the plane of the drawing generally in parallel with each other, such as orthogonal to the plane of the drawing. These two embodiments are shown schematically in FIGS. 3A–3B.

Figure 3A:
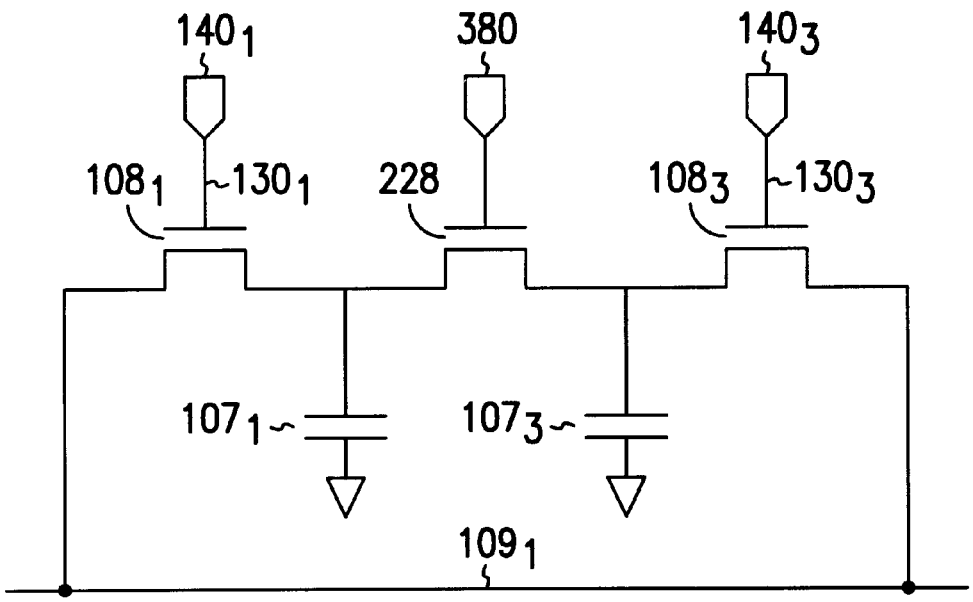
FIG. 3A is a schematic of a portion of a dynamic memory device having two adjacent memory cells associated with a single digit line.

FIG. 3A depicts the schematic of an embodiment where digit line 109/110 on the left side of FIG. 2 is the same digit line 109/110 on the right side of FIG. 2. With reference back to FIGS. 1A–1B, the schematic of FIG. 3A includes, as an example, storage capacitors $107_1$ and $107_3$, access transistors $108_1$ and $108_3$, word lines $130_1$ and $130_3$, word line drivers $140_1$ and $140_3$, and digit line $109_1$. FIG. 3A further includes a selective isolation device 228 and a device driver 380. Device driver 380 provides a control signal to selective isolation device 228 to determine its state. The control signal output of device driver 380 may be referred to herein as CPL. Device driver 380 may be a logic block to generate control signal CPL in response to one or more internal or external control signals, a fusible element generating control signal CPL in response to the state of the fusible element (such as an anti-fuse in its programmed or unprogrammed state), or a pin providing the control signal CPL in response to an externally-supplied signal.

With selective isolation device 228 in an inactive or off state, storage capacitors $107_1$ and $107_3$ are electrically isolated. Standard read/write operations can be performed on each cell individually as described with reference to FIGS. 1A–1B. Upon driving the device driver 380 to activate selective isolation device 228, i.e., placing selective isolation device 228 in an on state, storage capacitors $107_1$ and $107_3$ are electrically coupled to form a coupled capacitor pair. It can be seen in FIG. 3A that upon coupling storage capacitors $107_1$ and $107_3$ through selective isolation device 228, the coupled capacitor pair may be coupled to digit line $109_1$ by firing either word line driver $140_1$, to couple the coupled capacitor pair through storage capacitor $107_1$, or word line driver $140_3$, to coupled the coupled capacitor pair through storage capacitor $107_3$. Such alternative access paths permit defect isolation. As one example, if word line driver $140_1$, word line $130_1$ or access transistor $108_1$ are defective, coupled storage capacitors $107_1$ and $107_3$ could be accessed for read/write operations by using the word line driver $140_3$, word line $130_3$ and access transistor $108_3$. While the foregoing embodiment was depicted using storage capacitors $107_1$ and $107_3$ as examples, other combinations of storage capacitors with an interposing selective isolation device are permissible.

Figure 3B:
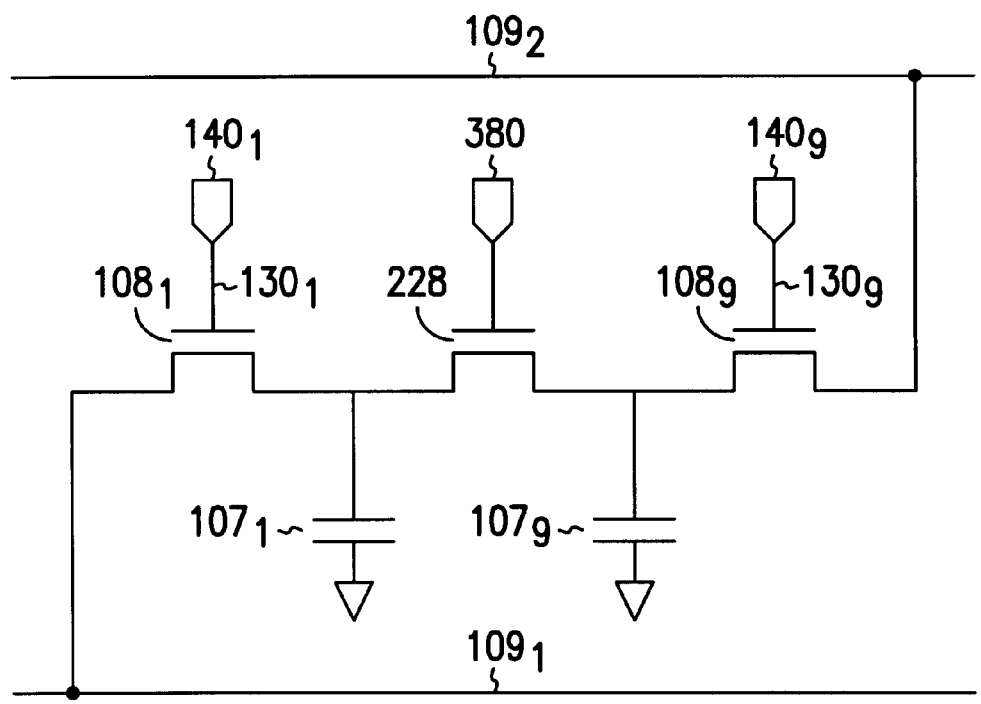
FIG. 3B is a schematic of a portion of a dynamic memory device having two adjacent memory cells associated with different digit lines.

FIG. 3B depicts the schematic of an embodiment where digit line 109/110 on the left side of FIG. 2 is distinct from digit line 109/110 on the right side of FIG. 2. With reference back to FIGS. 1A–1B, the schematic of FIG. 3B includes, as one example, storage capacitors $107_1$ and $107_9$, access transistors $108_1$ and $108_9$, word lines $130_1$ and $130_9$, word line drivers $140_1$ and $140_9$, digit line $109_1$ and digit line $109_2$. FIG. 3B further includes a selective isolation device 228 and a device driver 380.

With selective isolation device 228 in an inactive or off state, storage capacitors $107_1$ and $107_9$ are electrically isolated. Standard read/write operations can be performed on each cell individually as described with reference to FIGS. 1A–1B. Upon firing the device driver 380 to activate selective isolation device 228, i.e., placing selective isolation device 228 in an on state, storage capacitors $107_1$ and $107_9$ are electrically coupled to form a coupled capacitor pair. It can be seen in FIG. 3B that upon coupling storage capacitors $107_1$ and $107_9$ through selective isolation device 228, the coupled capacitor pair may be coupled to digit line $109_1$ through storage capacitor $107_1$ by firing word line driver $140_1$. Alternatively, the coupled capacitor pair may be coupled to digit line $109_2$ through storage capacitor $107_9$ by firing word line driver $140_9$. As with the previous embodiment, such alternative access paths permit defect isolation. As one example, if word line driver $140_1$, word line $130_1$ or access transistor $108_1$ are defective, coupled storage capacitors $107_1$ and $107_9$ could be accessed for read/write operations by using the word line driver $140_9$, word line $130_9$ and access transistor $108_9$. Furthermore, in this embodiment, the ability to couple storage capacitors $107_1$ and $107_9$ to either digit line $109_1$ or $109_2$ permits multiple read/write paths to the I/O lines. Accordingly, such embodiments further permit isolation of a defective digit line. While the foregoing embodiment was depicted using storage capacitors $107_1$ and $107_9$ as examples, other combinations of storage capacitors with an interposing selective isolation device are permissible.

Figure 4:
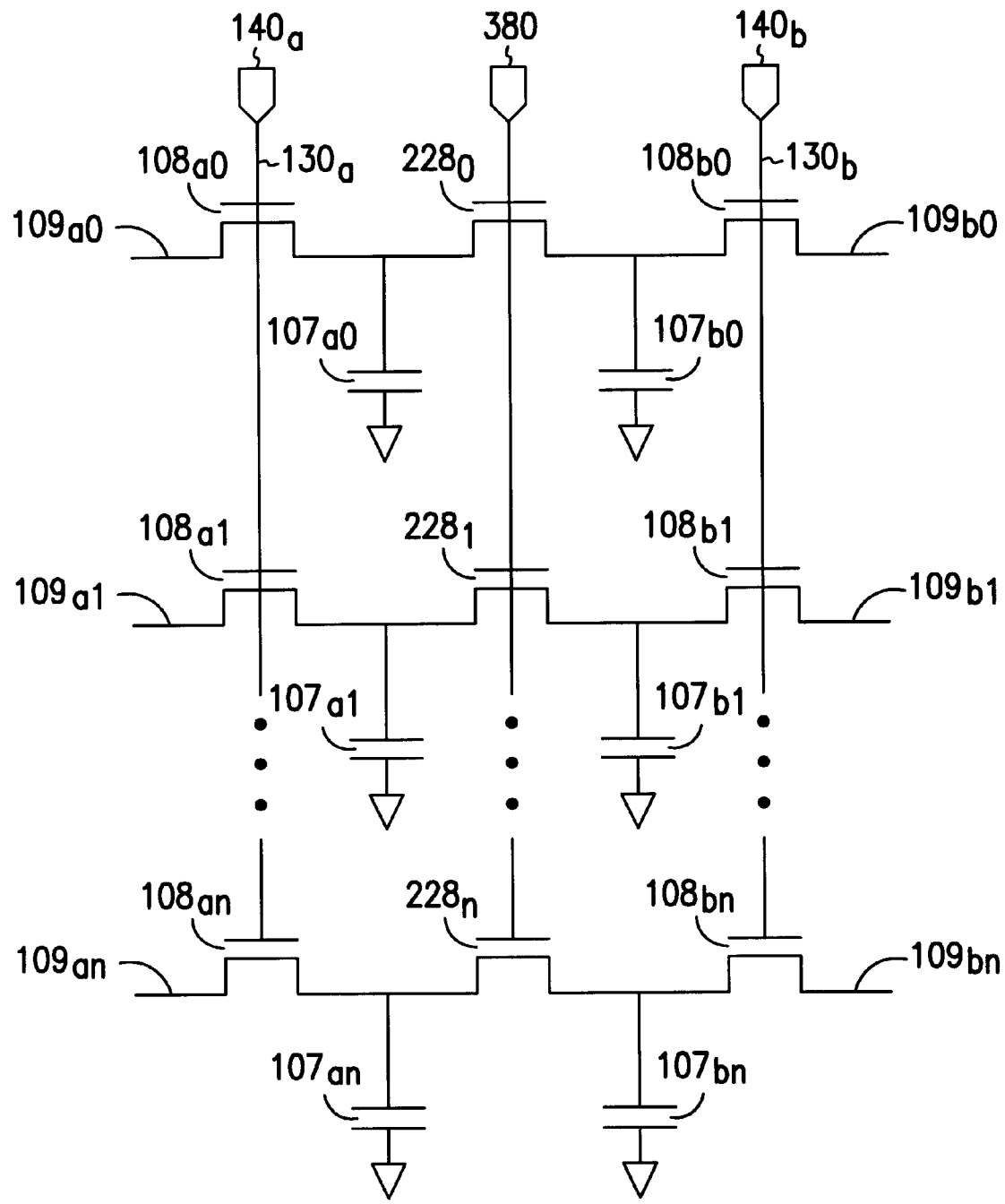
FIG. 4 is a schematic of a portion of a dynamic memory device showing the use of selective isolation devices to simultaneously couple adjacent storage capacitors for multiple sets of storage capacitors.

FIG. 4 is a schematic showing that the selective isolation devices can be used to simultaneously couple adjacent storage capacitors for multiple sets of storage capacitors. As shown in FIG. 4, driving device driver 380 activates selective isolation devices $228_0, 228_1, \ldots$ and $228_n$. This, in turn, couples adjacent storage capacitors $107_{a0}/107_{b0}, 107_{a1}/107_{b1}, \ldots$ and $107_{an}/107_{bn}$. In FIG. 4, the digit lines on the left side of the drawing may be the same as or distinct from the digit lines on the right side of the drawings. For example, digit line $109_{a0}$ may be the same as or distinct from digit line $109_{b0}$.

As further shown in FIG. 4, driving word line driver $140_a$ activates access transistors $108_{a0}, 108_{a1}, \ldots$ and $108_{an}$ while driving word line driver $140_b$ activates access transistors $108_{b0}, 108_{b1}, \ldots$ and $108_{bn}$. Such scenarios are common, allowing access of multiple data bits substantially simultaneously. In one embodiment, the address causing activation of word line driver $140_a$ differs from the address causing activation of word line driver $140_b$ by only one address bit. For example, in an 11-bit binary row address, the left-most 10 address bits are identical for each address, while the right-most or least significant address bit is a 0 for one address and a 1 for the other. While such differentiation offers conveniences for addressing the coupled storage capacitors, other locations for the distinguishing bit are permissible as well as differentiation involving more than one distinguishing address bit.

Figure 5A:
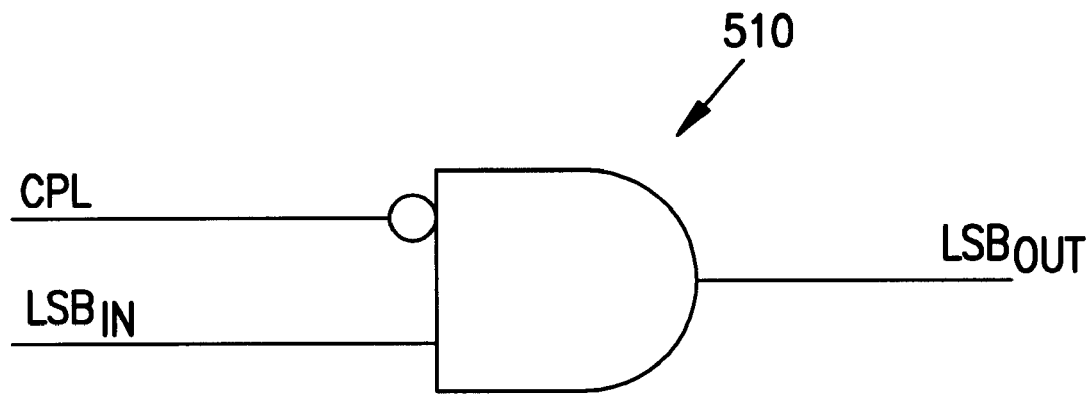
FIG. 5A is a logic diagram for use in address resolution.

Using an addressing scenario where adjacent storage capacitors are coupled to word lines whose addresses differ by one address bit, the same signal controlling the activation of the selective isolation devices can be used to select which word line will be used to couple the adjacent storage capacitors to their respective digit line. FIG. 5A shows a logic diagram of one embodiment of a logic circuit 510 for address resolution. Logic circuit 510 of FIG. 5A passes the least significant bit (LSB) when the control signal CPL is logic 0, representing electrical isolation of adjacent storage capacitors, and forces the LSB to logic 0 when control signal CPL is logic 1, representing electrical coupling of adjacent storage capacitors. The logic circuit 510 in FIG. 5A will output a logic 0 when control signal CPL is logic 1 regardless of whether the LSB input is logic 0 or logic 1, or whether it is simply floating or not driven, thus substantially ignoring the LSB of the memory cell address. Logic circuit 510 thus resolves the address to activate a predefined word line when CPL is logic 1, i.e., regardless of which of two addresses are input to logic circuit 510, logic circuit 510 of FIG. 5A will lead to activation of the word line corresponding to the address whose LSB is logic 0.

Figure 5B:
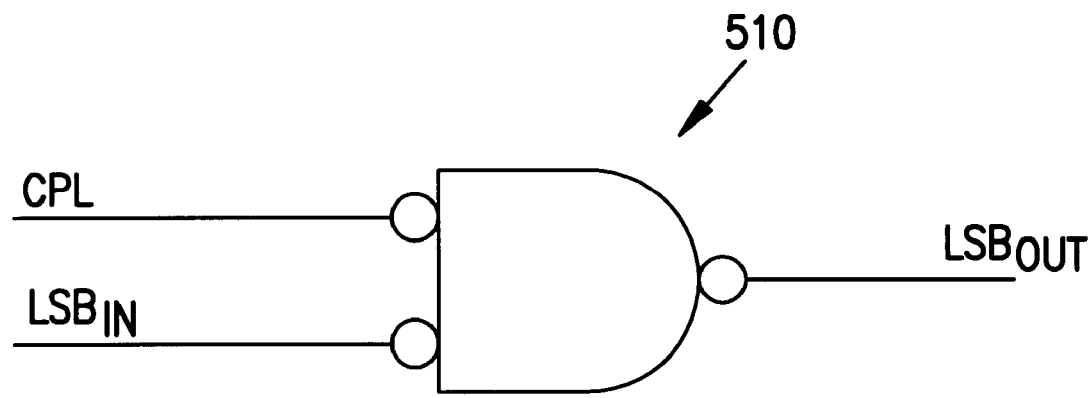
FIG. 5B is a logic diagram for use in address resolution.

FIG. 5B shows a logic diagram of another embodiment of a logic circuit 510 for address resolution. Logic circuit 510 of FIG. 5B passes the least significant bit (LSB) when the control signal CPL is logic 0, representing electrical isolation of adjacent storage capacitors, and forces the LSB to logic 1 when control signal CPL is logic 1, representing electrical coupling of adjacent storage capacitors. The logic circuit 510 in FIG. 5B will output a logic 1 when control signal CPL is logic 1 regardless of whether the LSB input is logic 0 or logic 1, or whether it is simply floating or not driven, thus substantially ignoring the LSB of the memory cell address. Logic circuit 510 thus resolves the address to activate a predefined word line when CPL is logic 1, i.e., regardless of which of two addresses are input to logic circuit 510, logic circuit 510 of FIG. 5B will lead to activation of the word line corresponding to the address whose LSB is logic 1.

Alternatively, the LSB of the address can be used to select which word line will be used to couple the adjacent storage capacitors to their respective digit line independent of the control signal CPL, i.e., the address is passed to the address decode circuitry unaltered. For each of the foregoing embodiments, addressing in the memory controller or processor accessing the memory device should be resolved such that a unique address is associated with each set of coupled storage capacitors. One example of this resolution would be to drop the LSB in the memory controller or processor, reducing the size of addressable memory by half, and thus not driving the LSB at the memory device. However, having a unique address for each set of coupled storage capacitors is not required. The user may desire to have multiple addresses, recognizing of course that each of the multiple addresses will be associated with the same data bit.

Figure 6:
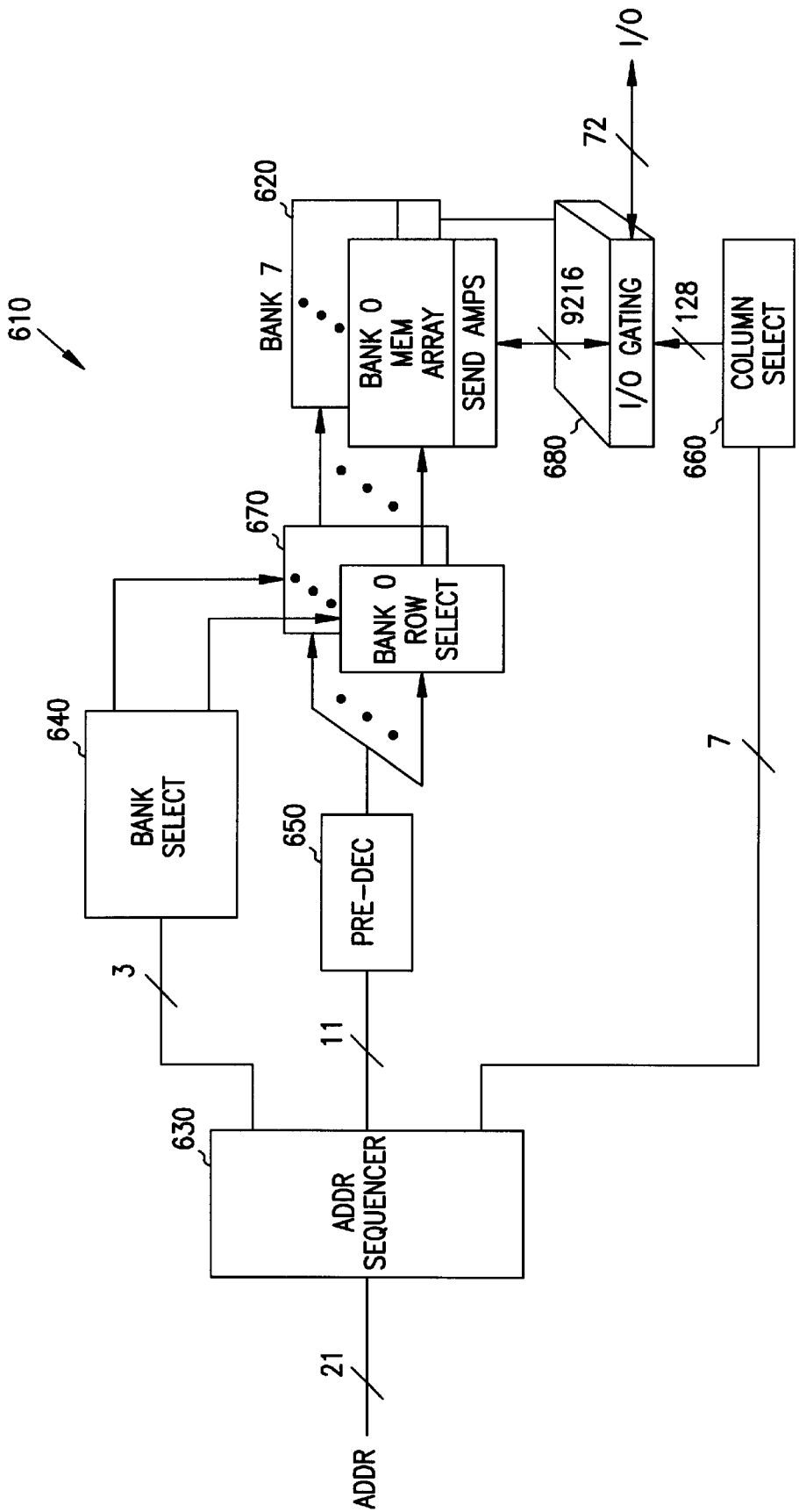
FIG. 6 is a block diagram of a portion of a memory device.

FIG. 6 is a functional block diagram of a portion of a memory device 610 used to illustrate one addressing scenario. Memory device 610 is adapted to selectively couple adjacent storage capacitors. The memory device 610 includes bank memory arrays 620 which contain memory cells organized in rows and columns for storing data. Bank memory arrays 620 are depicted as eight bank memory arrays, bank0 through bank7. In memory device 610, each bank memory array 620 is organized internally as 2048 rows by 128 columns by 72 bits. Those skilled in the art will recognize that different choices for the number of banks, rows and columns, and the bit width, are possible without altering the fundamental operation of the memory devices described herein.

Address sequencer 630 accepts a 21-bit address signal ADDR, generates a value representing the address of the selected bank memory array 620 and latches it in bank select 640. Address sequencer 630 further generates a value representing a row address of the selected bank memory array 620 and latches it in pre-decode 650. Address sequencer 630 still further generates a value representing a column address and latches it in column select 660.

The row address from pre-decode 650 is provided to bank row selects 670. In addition, bank select 640 provides the latched bank address to bank row selects 670. In response to the bank address and row address, bank row selects 670 activate the desired row of the desired memory bank for processing, to thereby activate the corresponding row of memory cells. Bank row selects 670 generally have a one-to-one relationship with bank memory arrays 620.

In the memory device 610 of FIG. 6, column select 660 activates 72 of the 128×72 (number of columns×bit width) lines provided to sense amplifiers and I/O gating circuit 680, the number of lines activated corresponding to the bit width of the device. The activated lines are then provided to the I/O lines.

By applying the logic circuit 510 of FIG. 5A or 5B to the LSB input to pre-decode 650, the LSB of the row address can be ignored as described above, and the output of the logic circuit 510 provides selection of the predefined access path to the coupled storage capacitors.

By activating the selective isolation device between each pair of storage capacitors in a memory device, the size of the memory device is effectively reduced by half, i.e., the number of uniquely addressable memory cells is reduced to approximately half of the original number of addressable memory cells. In addition, the storage capacitance of each memory cell is effectively doubled in that the capacitors are coupled in parallel. Exceptions are made at the periphery if there are no adjacent storage capacitor to couple to. However, placement of redundant memory cells at the periphery can provide the adjacent storage capacitors.

While activation of selective isolation devices between each pair of storage capacitors as described above has certain advantages regarding the addressing of memory cells, there is no requirement for such global activation. With addressing scenarios capable of individually addressing a row of memory cells, or even an individual memory cell, selective coupling of individual rows or individual memory cells is made possible.

As described herein, selective coupling of adjacent storage capacitors can increase the beta ratio of a memory location, albeit typically at a reduction in memory size. Increases in beta ratio may be used to improve device reliability or to enhance certain performance characteristics. The techniques of selective coupling of adjacent storage capacitors may also be used for defect isolation as described earlier.

The selective coupling may be dynamic or user-definable, i.e., coupling adjacent storage capacitors during a first period in response to a control signal in a first state, and electrically isolating them during a second period in response to the control signal in a second state. The selective coupling may be static, i.e., the selective isolation device may be permanently latched in the activated state. Such static selective coupling may involve techniques such as connecting the gate of the selective isolation device to a control potential through a programmable anti-fuse.

It will be understood that the above description of a dynamic random access memory (DRAM) is not a complete description of all the elements and features of a DRAM. The various embodiments of the invention are equally applicable to any size and type of memory circuit and is not intended to be limited to the DRAM described above. As examples, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs. Furthermore, the various embodiments of the invention can be utilized in integrated circuit devices other than a DRAM, where adjacent semiconductor devices of the same type, such as adjacent capacitors, are separated by an interposing selective isolation device.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

With reference to FIG. 7, in one embodiment, a semiconductor die 710 is produced from a silicon wafer 700. A die is an individual pattern, typically rectangular, on a substrate that contains circuitry, or integrated circuit devices, to perform a specific function. For one embodiment, the integrated circuit devices of the die 710 contain at least one memory device adapted for selective coupling of adjacent storage capacitors. For another embodiment, the at least one integrated circuit device of die 710 contains adjacent semiconductor devices of the same type, such as adjacent capacitors, separated by an interposing selective isolation device. A semiconductor wafer will typically contain a repeated pattern of such dies containing the same functionality. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

As shown in FIG. 8, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

FIG. 9 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 9.

Electronic Systems

FIG. 10 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 11:
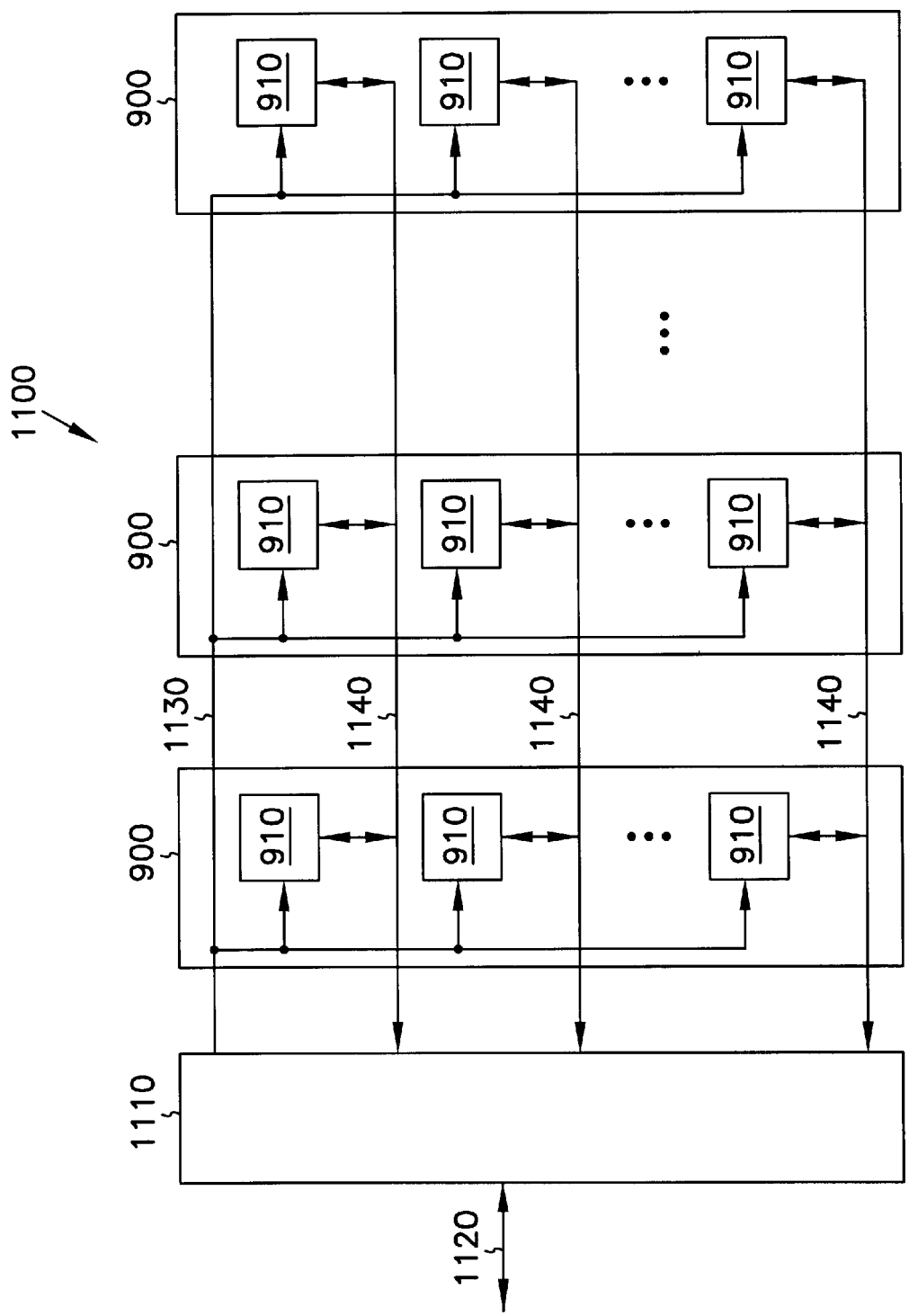
FIG. 11 is a block diagram of a memory system.

FIG. 11 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 12:
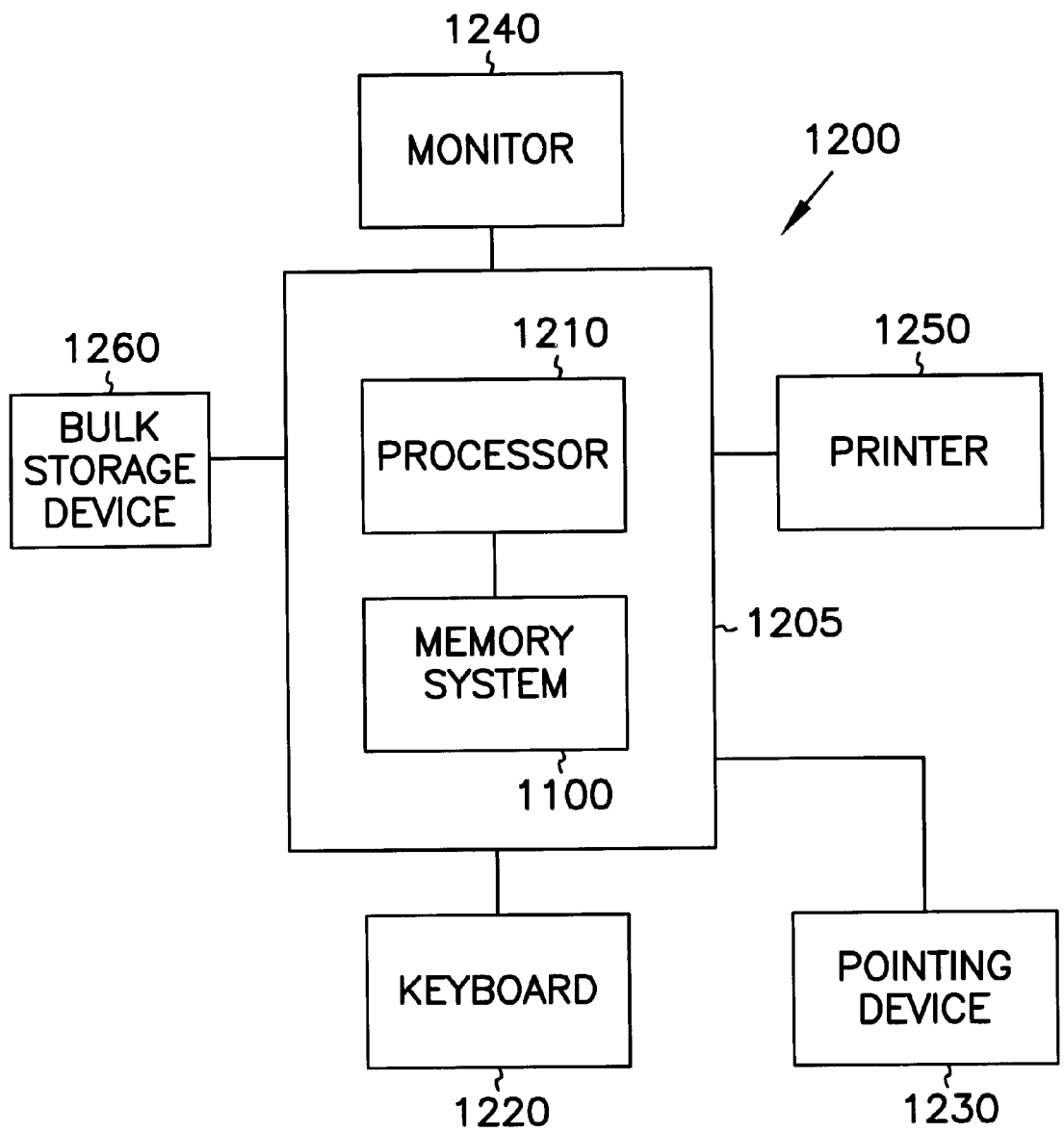
FIG. 12 is a block diagram of a computer system.

FIG. 12 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 12 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Memory devices and other integrated circuit devices having a first capacitor and a second capacitor with an interposing selective isolation device have been described. Furthermore, methods of operation of such devices have also been described. A selective isolation device is a device selectively in a state of conductance or non-conductance. When the selective isolation device is in a state of conductance, the first capacitor is coupled to the second capacitor. When the selective isolation device is in a state of non-conductance, the first capacitor is electrically isolated from the second capacitor. In memory devices, such parallel coupling of adjacent storage capacitors of adjacent memory cells is useful in increasing beta ratio and providing defect isolation. Such coupling of adjacent storage capacitors generally reduces the number of uniquely addressable memory cells.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other signals or combinations of signals may be utilized in place of the signals described in the example embodiments, and alternative logic diagrams may be incorporated at the designer's discretion. Accordingly, this application is intended to cover any adaptations or variations of the invention. It is manifestly intended that this invention be limited only by the following claims and equivalents thereof.

What is claimed is:

1. A method of operating a memory device having a plurality of addressable memory cells and having a memory size, comprising:

reducing the memory size to approximately half by coupling storage capacitors of adjacent memory cells of the plurality of addressable memory cells, thereby producing a plurality of coupled capacitor pairs; and resolving addresses provided to the memory device to select an access path to one storage capacitor of each of the coupled capacitor pairs.

2. The method of claim 1, further comprising:

providing an alternative access path to each coupled storage capacitor if the access path is defective.

3. The method of claim 1, further comprising:

selectively decoupling one or more coupled storage capacitors of adjacent memory cells thereby electronically isolating the decoupled storage capacitors.

4. The method of claim 3, further comprising:

dynamically increasing the memory size of the memory device while the decoupled storage capacitors are electronically isolated.

5. The method of claim 1, wherein the memory size is dynamic resolved during the operation of the memory device.

6. A method of operating a memory device, comprising:

selectively coupling adjacent storage capacitors of adjacent memory cells establishing a plurality of coupled capacitor pairs; and permitting each coupled capacitor pair to be accessed as a single unit thereby increasing a beta ratio associated with operating the memory device.

7. The method of claim 6, further comprising:

increasing a storage capacitance associated with operating the memory device for each coupled capacitor pair.

8. The method of claim 6, further comprising:

selectively electronically isolating one or more of the adjacent storage capacitors thereby destroying the associated established coupled capacitor pair.

9. The method of claim 6, further comprising:

reducing a memory size associated with the memory device for each established coupled capacitor pair.

10. A method of operating a memory device having a plurality of addressable memory cells, comprising:

providing an initial memory size associated with the memory device;

providing an initial capacitance associated with the memory device;

selectively permitting adjacent storage capacitors of adjacent memory cells to be coupled to form coupled capacitor pairs;

accessing each coupled capacitor pair by resolving addresses to the coupled storage capacitors, wherein a least significant bit associated with a resolved address is ignored;

proportionally increasing the initial capacitance of the memory device for each coupled capacitor pair; and proportionally decreasing the initial memory size of the memory device for each coupled capacitor pair.

11. The method of claim 10, further comprising:

re-establishing the initial memory size of the memory device by decoupling each coupled capacitor pair; and re-establishing the initial capacitance of the memory device by decoupling each coupled capacitor pair.

12. The method of claim 10, wherein for each coupled capacitor pair the addressable memory cells of the memory device is decreased.

13. A method of operating a dynamic memory device, comprising:

doubling a storage capacitance associated a first storage capacitor of a first memory cell by coupling the first storage capacitor to a second storage capacitor of a second memory cell to form a coupled capacitor pair;

decreasing a memory size associated with the dynamic memory device once the coupled capacitor pair is formed; and permitting a first and second address to access the coupled capacitor pair through a first access path.

14. The method of claim 13, further comprising:

ignoring a first least significant bit associated with the first address and a second least significant bit associated with the second address to permit the first and second addresses to access the coupled capacitor pair.

15. The method of claim 13, further comprising:

permitting the first and second addresses to access the coupled capacitor pair through a second access path.

16. The method of claim 15, wherein the access paths are coupled to at least one of the first storage capacitor and the second storage capacitor and the coupled capacitor is coupled to a digit line.

17. A method of operating a memory device having a predefined memory size, comprising:

reducing the memory size of the memory device by coupling adjacent storage capacitors of adjacent memory cells;

granting access to the coupled adjacent storage capacitors through one or more access paths; and re-establishing the memory size of the memory device by decoupling the adjacent storage capacitors.

18. The method of claim 17, further comprising:

electronically isolating the adjacent storage capacitors when decoupled permitting each adjacent storage capacitor to be independently accessed.

19. The method of claim 18, wherein isolating the adjacent storage capacitors includes isolation by forming at least one of a formation of a field of oxide interposed between the adjacent storage capacitors, an insulated trench interposed between the adjacent storage capacitors, and a field effect transistor interposed between the adjacent storage capacitors.

20. The method of claim 19, wherein the isolated adjacent storage capacitors inhibit a charge leakage to the adjacent memory cells.

21. A method of reducing a power consumption associated with operating a memory device, comprising:

identifying the power consumption associated with operating the memory device;

coupling adjacent storage capacitors of adjacent memory cells to form selective isolation devices, each selective isolation device associated with a single coupled adjacent storage capacitor pair, and wherein each adjacent memory cell represents approximately half of a memory size associated with each pair of adjacent memory cells; and concurrently accessing each selective isolation device as a single memory cell thereby increasing a capacitance associated with operating the memory device and decreasing the power consumption associated with operating the memory device.

22. The method of claim 21, further comprising:

granting access to each selective isolation device over a digit line through at least one of a first access path and a second access path.

23. The method of claim 21, further comprising:

recognizing a first and second address as a single reference for each selective isolation device thereby permitting the single reference to be handled as if it were an access request to the single memory cell.

24. A method of operating a dynamic memory device having a plurality of addressable memory cells, comprising:

providing a plurality of adjacent memory cells wherein each adjacent memory cell pair includes a first address and a second address operable to uniquely identify a first memory cell and a second memory cell of the adjacent memory cell pair;

selectively combining one or more adjacent memory cell pairs to form a coupled memory cell pair; and permitting each first address and each second address associated with a coupled memory cell pair to be accessed as a single memory cell using at least one of the first address and the second address.

25. The method of claim 24, further comprising:

reducing a memory size associated with operating the memory device for each coupled memory cell pair.

26. The method of claim 24, further comprising:

increasing a capacitance associated with operating the memory device for each coupled memory cell pair.

27. The method of claim 24, further comprising:

selectively isolating one or more of the coupled memory cell pairs.

28. A method of operating a dynamic memory device, comprising:

dynamically generating a plurality of coupled capacitor pairs from a plurality of predefined memory cells associated with the memory device;

dynamically reducing a memory size associated with the memory device for each coupled capacitor pair generated;

dynamically increasing a capacitance associated with operating the memory device for each coupled capacitor pair generated; and dynamically granting access to each coupled capacitor pair.

29. The method of claim 28, further comprising:

dynamically removing one or more of the coupled capacitor pairs permitting the predefined memory cells associated with the coupled capacitor pairs to be accessed independent of one another.

30. The method of claim 29, wherein when generating the coupled capacitor pairs, the coupled capacitor pairs are formed from predefined adjacent memory cells associated with the memory device.

31. A method of combining a plurality of addressable memory cells during the operation of a memory device, comprising:

identifying a plurality of adjacent memory cells and selectively forming a plurality of coupled memory cells, wherein each coupled memory cell has a first memory cell address associated with a first coupled memory cell and a second memory cell address associated with a second coupled memory cell; and ignoring a least significant bit associated with each first memory cell address and each second memory cell address and combining references to both addresses to grant access to the coupled memory cell associated with the addresses.

32. The method of claim 31, further comprising:

selectively removing one or more coupled memory cells.

33. The method of claim 31, wherein access is granted to each coupled memory cell over a digit line through at least one of a first access path and a second access path.

* * * * *